(12) United States Patent
Locatelli et al.

(10) Patent No.: US 6,657,433 B1
(45) Date of Patent: Dec. 2, 2003

(54) PORTABLE NMR MEASUREMENT DEVICE

(75) Inventors: Marcel Locatelli, Montbonnot (FR); Viviane Cattine, Grenoble (FR); Christian Jeandey, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 76 days.

(21) Appl. No.: 09/594,344

(22) Filed: Jun. 15, 2000

(30) Foreign Application Priority Data

Jun. 23, 1999 (FR) ............................................. 99 08022

(51) Int. Cl.[7] .................................................. G01V 3/00
(52) U.S. Cl. ......................... 324/318; 324/322; 600/410
(58) Field of Search ................................ 324/309, 318, 324/370, 307, 319, 322; 600/420, 410; 335/306

(56) References Cited

U.S. PATENT DOCUMENTS

| | | | | |
|---|---|---|---|---|
| 4,714,881 A | | 12/1987 | Givens | |
| 4,727,327 A | * | 2/1988 | Toyoshima et al. | 324/309 |
| 5,390,673 A | * | 2/1995 | Kikinis | 600/410 |
| 5,572,132 A | * | 11/1996 | Pulyer et al. | 324/318 |
| 5,631,561 A | * | 5/1997 | Stetter | 324/322 |
| 5,731,704 A | * | 3/1998 | Schnur et al. | 324/320 |
| 5,900,793 A | | 5/1999 | Katznelson et al. | |
| 5,959,454 A | * | 9/1999 | Westphal et al. | 324/320 |

FOREIGN PATENT DOCUMENTS

| | | |
|---|---|---|
| GB | 2137757 | 10/1984 |
| WO | WO99/00803 | 1/1999 |

OTHER PUBLICATIONS

G. Eidmann et al., "The NMR–MOUSE a Mobile Universal Surface Explorer" Journal of Magnetic Resonance Series A 122 pp. 104–109, 1996.*

B. Blumich et al., "The NMR–MOUSE Construction, Excitation, and Applications", Magnetic Resonance Imaging, vol. 16, Nos. 5/6. 1998 pp. 479 through 484.*

* cited by examiner

*Primary Examiner*—Diego Gutierrez
*Assistant Examiner*—Tiffany A. Fetzner
(74) *Attorney, Agent, or Firm*—Thelen Reid & Priest LLP; Robert E. Krebs

(57) ABSTRACT

The invention relates to an NMR device for detection of resonant protons contained in an object. The device comprises permanent magnets for producing a static and uniform magnetic field in a region located outside the device with respect to which the object will be positioned, these permanent magnets being laid out around an axis on which the said region is located, such that their magnetization direction is directed towards the said region and such that the magnetization values of the permanent magnets combine their effects to produce the static and uniform magnetic field in the said region. The device also comprises means for emission of an electromagnetic signal to the said region and reception of an electromagnetic signal returned from the said region in response to the emitted signal, these means being located inside the space delimited by the said permanent magnets.

10 Claims, 2 Drawing Sheets

PORTABLE NMR MEASUREMENT DEVICE

TECHNICAL FIELD

This invention relates to a device for characterizing an object or a product enclosing components containing protons that can be identified using the nuclear magnetic resonance or NMR phenomenon.

STATE OF PRIOR ART

NMR measurement devices have been developed for uses in different technical fields. For the example of the oil industry, there are the oil well tools divulged by U.S. Pat. Nos. 3,483,465, 3,667,035, 4,480,227, 4,629,986, 4,710, 713, 5,486,761, 5,488,342, 5,610,522 and 5,646,528, and tools for taking cores divulged by U.S. Pat. Nos. 4,480,227, 4,564,811 and 4,885,540. U.S. Pat. Nos. 3,966,973, 4,701, 705 and 5,594,340 are applicable to the food processing field, and U.S. Pat. No. 5,672,968 is applicable to concrete.

In "open" NMR devices, the product or the object to be characterized is located outside the volume of the device. In this special case, the critical parameters of NMR devices are the RF emission power and the level of the polarization induction produced by a magneto-static system; usually an electromagnet or permanent magnets in the case of mobile systems.

In order to optimize the efficiency of permanent magnets, open NMR devices according to prior art use structures (polar parts, yokes) made of a soft magnetic material. This subject is discussed in U.S. Pat. Nos. 5,610,522 and 5,672, 968. The presence of these structures significantly increases the weight of the device.

Furthermore, in order to limit external disturbances, they use RF screens that further increase the weight of the device (see U.S. Pat. No. 5,672,968).

DISCLOSURE OF THE INVENTION

The invention relates to an open NMR device with a spatial resolution of a few cm$^3$, a minimum weight and a minimum power consumption so that it is easily maneuverable, independent and has a minimum cost price. Making an NMR device portable introduces constraints on the weight of polar parts and screens. The efficiency of the structure then needs to be maximized.

In order to reach this result, it is proposed to combine permanent magnets with an optimized magnetization direction in order to obtain the maximum magnetic energy density in a determined volume corresponding to the required spatial resolution of the measurement system.

The RF screens are eliminated, since the measurement antenna is protected due to a self-shielding phenomenon.

Therefore, the purpose of the invention is an NMR device for detection of resonant protons contained in an object, the device comprising means with. permanent magnets for producing a static and uniform magnetic field in a region located outside the device with respect to which the object will be positioned, the device also comprising means of emitting an electromagnetic signal to the said region and reception of an electromagnetic signal returned from the said region in response to the said emitted signal, in which:

the said means with permanent magnets comprise permanent magnets located around an axis on which the said region is located, such that their magnetization direction is directed towards the said region and such that the magnetization values of the said permanent magnets combine their effects to produce the said static and uniform magnetic field in the said region, the means for emission and reception of the said electromagnetic signals are located inside the space delimited by the said permanent magnets.

Advantageously, the axis around which the said permanent magnets are laid out forms an axis of symmetry for these permanent magnets. In this case, the permanent magnets located around this axis may be placed adjacent to each other to form a tube. This tube may then have a polygonal cross-section, in other words its outside and inside limits are in the shape of a polygon. The device may also comprise hoop reinforcement means made of a non-magnetic material around the tube. It may also comprise a cover made of a non-magnetic electrical conducting material to enclose the tube except for the face of the tube in front of the said region. Advantageously, this cover is closed on the side of the face of the tube located in front of the said region, by a plate made of a non-magnetic dielectric material.

The magnetization direction may be at an angle of the order of 45° with respect to the said axis.

Advantageously, the permanent magnets are chosen among permanent magnets based on rare earths, ferrite and alnico. For example, they may be made of a material chosen among NdFeB and SmCo.

The means for emission and reception of electromagnetic signals may be composed of a solenoid coil, the turns of which approximately delimit a hemisphere open towards the said region.

BRIEF DESCRIPTION OF THE DRAWINGS

The invention will be better understood and other advantages and specific features will become clear after reading the following description given as a non-restrictive example, accompanied by the attached drawings in which.

DETAILED DESCRIPTION OF AN EMBODIMENT OF THE INVENTION

Figure 1:
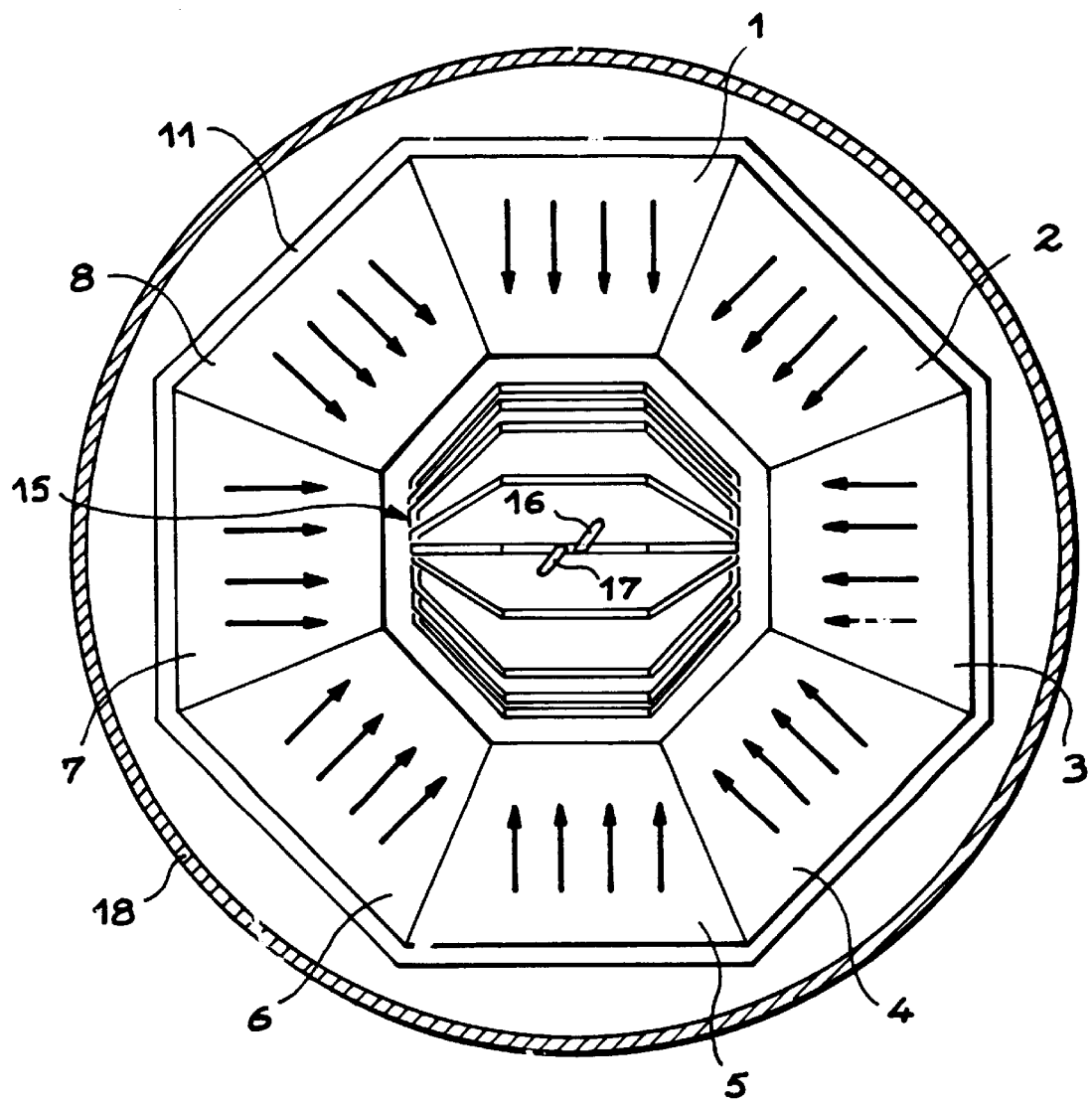
FIG. 1 is a view of a portable NMR measurement device according to this. invention, along section I—I in FIG. 2.
Figure 2:
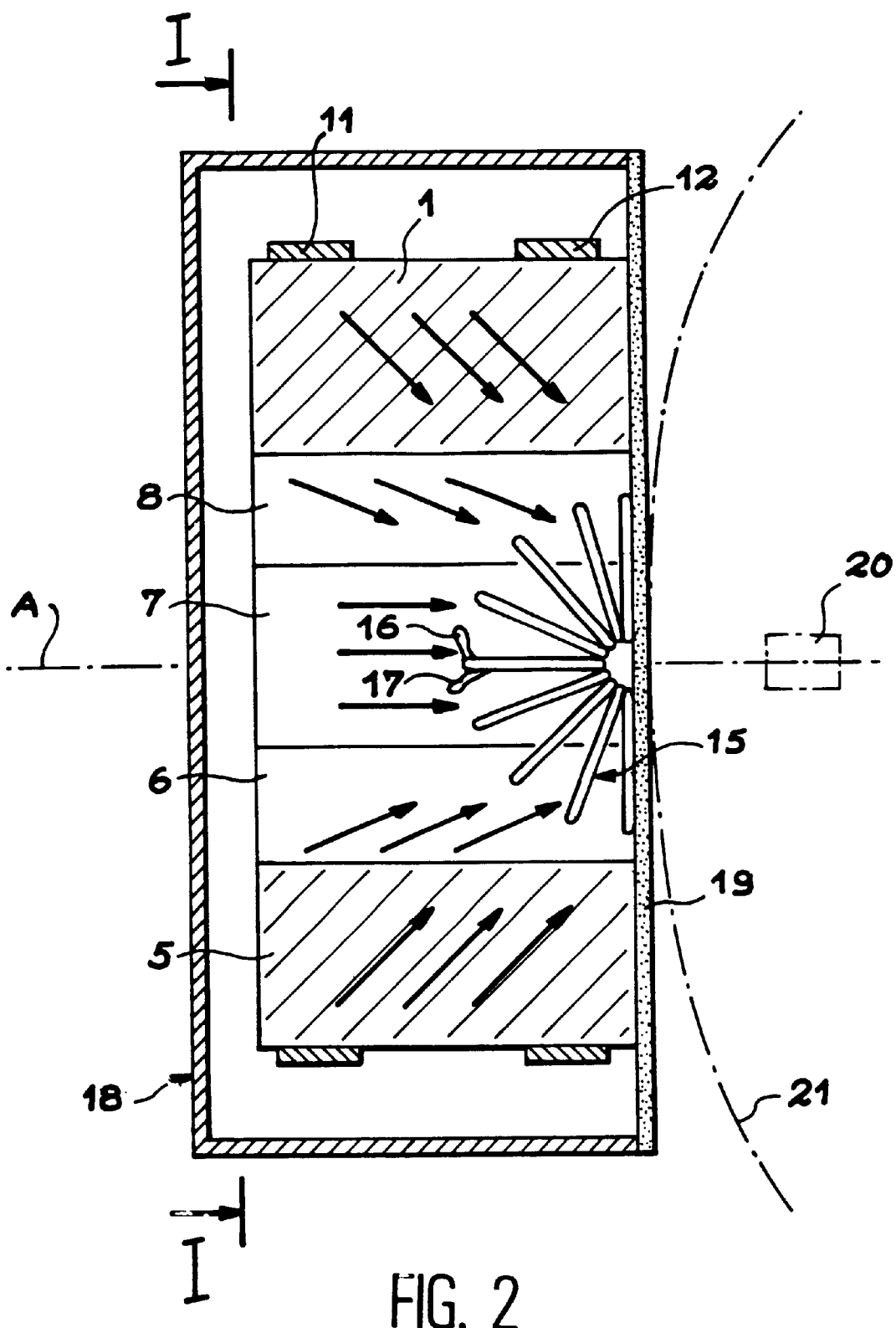
FIG. 2 is a side cross-sectional view of the device shown in FIG. 1.

In the embodiment shown in FIGS. 1 and 2, the device uses eight permanent magnets referenced 1 to 8.

These eight permanent magnets are all exactly the same size and shape as shown in FIG. 1. The section that can be seen in FIG. 1 is trapezoidal. For example, the large base measures 65 mm and the height of the trapezium is 41.6 mm. The visible section in FIG. 2 for magnets 1 and 5 is rectangular. For example, the length measures 47.5 mm.

Permanent magnets 1 to 8 are assembled together to form a tube with an octagonal cross section, as shown in FIG. 1. Therefore, they are placed adjacent to each other. Therefore, the angle at the summit of the trapeziums is 45°.

Magnets 1 to 8 may be magnets with rare earths, particularly made of NdFeB for applications at temperatures of between −10° C. and 180° C. SmCo magnets will be used for higher temperatures.

The magnetization direction of these magnets is of the order of 45° with respect to the main axis A of the structure. This magnetization direction is shown by arrows in FIGS. 1 and 2.

The magnets assembly is held together mechanically by reinforcing hoops 11 and 12 made of a non-magnetic material and with a low electrical conductivity. They may be made from stainless steel.

The volume of interest 20 in which the induced static magnetic field is uniform, is located on the main axis A. Its general shape for this embodiment is cylindrical. For magnets with the dimensions and materials described above, the induction obtained is of the order of 0.17 T. The volume of interest 20 corresponds to a 15 mm diameter and 12 mm long cylinder occupying 2 $cm^3$, the center of which is located 25 mm from the output from the magnetic system. The weight of the system for NdFeB magnets is of the order of 5.4 kg.

Electromagnetic signals are emitted to object 21 to be studied from only one side of the device as shown in FIG. 2, and the response signal is received through antenna 15 that is composed of a solenoid coil in which the turns approximately delimit a hemisphere placed inside the magnets system and open towards the volume of interest 20. The electrical ends 16, 17 of the antenna are approximately at the center of the magnets structure. With this configuration, the antenna 15 can be inserted in the magnetic structure, thus providing self-shielding from the external environment.

The tubular structure represented by permanent magnets acts as an electromagnetic screen for the antenna due to the non-zero conductivity of rare earth magnets. This effect is complemented by the protection cover 18 made of a non-magnetic electrical conducting material, for example stainless steel or brass. The cover bearing surface is composed of a plate 19 made of a non-magnetic dielectric material, for example plastic with a wear-resistant ceramic coating.

What is claimed is:

1. A portable self-shielded NMR device that detects resonant protons contained in an object, the device comprising:
   a permanent magnet means that produces a static, uniform magnetic field from one side of the device in a region also located outside the device with respect to which the object will be positioned, said permanent magnet means comprising a plurality of permanent magnets, which are substantially the same size and shape, located adjacent to one another with the sides of each of the adjacent permanent magnets, arranged to meet one another with no gap between each of the adjacent sides, and wherein the arrangement of the permanent magnets forms a self-shielded tube around an axis on which said outside region is located, such that the magnetization direction of each of the permanent magnets is directed toward said region, wherein the magnetization values of each of said plurality of permanent magnets combine their effects to produce the static, uniform magnetic field within said object in said region outside of the device;
   an emission means that emits an electromagnetic signal to said object and said region outside the device; and
   a reception means that receives an electromagnetic signal from said object and said region outside the device in response to said emitted signal,
   wherein the emission and reception means is located inside the real self-shielded tubular volume of said permanent magnets.

2. The device according to claim 1, in which the axis about which said plurality of permanent magnets are laid out forms an axis of symmetry for each of the permanent magnets.

3. The device according to claim 1, in which the cross-section of said self-shielded tube is polygonal.

4. The device according to claim 1, further comprising a reinforcement means (11, 12) made of a non-magnetic material mechanically holding together said plurality of permanent magnets around said self-shielded tube.

5. The device according to claim 1, further comprising a cover (18) made of a non-magnetic electrical conducting material to enclose the self-shielded tube except for the face of the self-shielded tube that is located in front of said region which is adjacent to the object from which protons are detected.

6. The device according to claim 5, in which the cover (18) is closed on the side of the face of the self-shielded tube located in front of said region by a plate (19) made of a nonmagnetic dielectric material.

7. The device according to claim 1, in which said magnetization direction of each of the plurality of permanent magnets, forms an angle on the order of 45 degrees with each adjacent permanent magnet with respect to said axis.

8. The device according to claim 1, in which said plurality of permanent magnets are chosen among permanent magnets based on rare earths, ferrite and alnico.

9. The device according to claim 8, in which said plurality of permanent magnets are made of a material chosen among NdFeB and SmCo.

10. The device according to claim 1, in which said means for emission and reception of electromagnetic signals comprises a solenoid coil, in which the turns approximately delimit a hemisphere open towards said region outside the device.

* * * * *